(12) United States Patent
Iwanaga et al.

(10) Patent No.: US 7,510,784 B2
(45) Date of Patent: *Mar. 31, 2009

(54) LIGHT EMITTING DEVICE FORMED USING RARE EARTH COMPLEX AND LUMINESCENT MEDIUM

(75) Inventors: Hiroki Iwanaga, Yokohama (JP); Fumihiko Aiga, Yokohama (JP); Naomi Shida, Tokyo (JP); Akio Amano, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/763,197

(22) Filed: Jun. 14, 2007

(65) Prior Publication Data

US 2007/0236129 A1    Oct. 11, 2007

Related U.S. Application Data

(63) Continuation of application No. 10/873,282, filed on Jun. 23, 2004, now Pat. No. 7,250,117.

(30) Foreign Application Priority Data

Jun. 24, 2003    (JP) .............................. 2003-179811

(51) Int. Cl.
    *H01L 51/50* (2006.01)
(52) U.S. Cl. ...................... 428/690; 428/917; 313/504; 313/506
(58) Field of Classification Search .................. None
    See application file for complete search history.

(56) References Cited

U.S. PATENT DOCUMENTS 5,731,599 A * 3/1998 Hwang et al. ................. 257/40
6,084,250 A * 7/2000 Justel et al. .................... 257/89
7,250,117 B2 * 7/2007 Iwanaga et al. ........ 252/301.16
2004/0253477 A1    12/2004 Kathirgamanathan et al.

FOREIGN PATENT DOCUMENTS

JP        2003-81986        3/2003
WO        WO 02/43446 A1    5/2002

OTHER PUBLICATIONS

Iwanaga et al., Journal of Alloys and Compounds, 408-412 (2006), p. 921-925.*

(Continued)

*Primary Examiner*—Dawn Garrett
(74) *Attorney, Agent, or Firm*—Oblon, Spivak, McClelland, Maier & Neustadt, P.C.

(57) ABSTRACT

A light emitting device includes a light emitting element and a luminescent medium. The luminescent medium contains a rare earth complex wherein a compound represented by the following formula (1) is employed as a ligand:

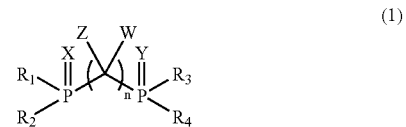

(1)

wherein X and Y are the same or different and are individually O, S or Se; $R_1$, $R_2$, $R_3$ and $R_4$ are the same or different, excluding a situation where $R_1$, $R_2$, $R_3$ and $R_4$ are all the same as each other, and are individually an alkyl or alkoxy group of a linear or branched structure having not more than 20 carbon atoms, a phenyl group, a biphenyl group, a naphthyl group, a heterocyclic group or a substitution product of any of these groups; n is an integer ranging from 2 to 20; and Z and W are the same or different and are individually a hydrogen atom, a deuterium atom, a halogen atom or an alkyl group.

17 Claims, 1 Drawing Sheet

OTHER PUBLICATIONS

Kazuki Nakamura, et al., "Red Emission Narrowing of EU(III) Complexes With Asymmetric Structure", Kidorui, 42, 2003, pp. 134-135.
Yasuchika Hasegawa, et al., "Detail CD Spectra Analysis in View of Angular Momentum Using Chiral EU(III) Complexes", Kidoni, 42, (2003), pp. 132-133.
Yasuchika Hasegawa, "How to Enhance the Luminescence of Neodymium (III) in Organic Media", Kagaku To Kogyo, Chemistry and Industry, vol. 53, No. 2, 2000, pp. 126-130.
Shozo Yanagida, et al., "Luminescence of Neodymium (III) in Organic Media: Ligand Designs for the Remarkable Luminescence and Their Evolution", Journal of Organic Synthetic Chemistry Association, vol. 58, No. 10, 2000, pp. 945-955.
Yasuchika Hasegawa, et al., "Enhanced Luminescence of Lanthanide(III) Complexed in Polymer Matrices", Chemistry Letters 1999, pp. 35-36.
S. Yanagida, Phosphor Research Society, The 292nd Meeting Technical Digest 3E09, "Development of Luminescent Materials With Lanthanide Complexes", Apr. 3, 2002.
S. Yanagida, et al., Phosphor Research Society, The 293rd Meeting Technical Digest, pp. 15-23, "Molecular Designs of Lanthanide Complexes for Remarkable Luminescence and Their Applications", Jun. 28, 2002.
Inorganic Chemistry, (2001), vol. 40, p. 4420-4427.
Journal of Alloys and Compounds, vol. 192, Issues 1-2, Feb. 23, 1993, p. 211-216; abstract and HCAPLUS printout for article.
Koide, Yasuhiro et al. "New chiral lanthanide complexes with optically pure ethanediylbis (t-butylphenylphosphine oxide)", Journal of Alloys and Compounds, 192 (1993), p. 211-216.
Wenping Hu, et al. "Efficient red electroluminescence from devices having multilayers of a europium complex" Applied Physics Letters, Aip American Institute of Physics, Melville, NY, US, XP012026979, vol. 77, No. 26, Dec. 25, 2000, pp. 4271-4273.
Simone Capecchi, et al. "High-Efficiency organic electroluminescent devices using an organoterbium emitter", Advanced materials, Wiley VCH, Weinheim, De, XP000976737, vol. 12, No. 21, Nov. 2, 2000, pp. 1591-1594.

* cited by examiner

LIGHT EMITTING DEVICE FORMED USING RARE EARTH COMPLEX AND LUMINESCENT MEDIUM

CROSS REFERENCE TO RELATED APPLICATIONS

This application is a continuation of U.S. patent application Ser. No. 10/873,282, filed Jun. 23, 2004, now U.S. Pat. No. 7,250,117, the disclosure of which is incorporated herein by reference in its entirety. This application claims priority to Japanese Application Number 2003-179811, filed Jun. 24, 2003, the disclosure of which is incorporated herein by reference in its entirety.

BACKGROUND

The present invention relates to a light emitting device which is excellent in color purity, color rendering properties and durability, and also to a luminescent medium where the aforementioned light emitting device is employed.

Nowadays, light emitting devices using inorganic fluorescent substance are now being rapidly improved in terms of the luminous efficiency thereof. In particular, the luminous efficiency of white light emitting devices is now expected to surpass the luminous efficiency of a fluorescent lamp in the near future. However, when it is desired to employ light emitting devices in a lighting system, there are many situations where light emitting devices are required to be excellent not only in luminous efficiency but also in color rendering properties. In the case of the light emitting devices where only an inorganic fluorescent substance is employed however, it is now considered very difficult to satisfy all of these properties required in a lighting system.

The idea to employ an organic fluorescent substance for light emitting devices is well known. However, light emitting devices where an organic fluorescent substance is employed as a luminous medium have not yet been put into practical use due to the following problems.

1) Particularly in the case where a near-ultraviolet LED chip is employed as a light source as currently increasingly employed and where an organic fluorescent substance is employed for light emitting devices comprising luminous medium of R, G and B, the organic compound employed therein is caused to deteriorate considerably due to ultraviolet rays. The reason for this can be ascribed to the fact that organic compounds are generally vulnerable to ultraviolet rays. In particular, when an organic compound exhibits absorption of light based on n-n transition in the near-ultraviolet zone, the organic compound would be rapidly deteriorated.

2) An organic fluorescent substance may exhibit the fluctuation of fluorescence spectrum depending on the concentration thereof, so that it is difficult to control the spectrum thereof. Furthermore, the intensity of fluorescence of organic fluorescent substance may also fluctuate depending on the concentration thereof, so that the concentration extinction would be caused to generate at a high-concentration zone thereof.

3) The fluorescence spectrum of an organic fluorescent substance may be fluctuated depending on the kinds of polymer employed for dispersing the organic fluorescent substance.

Generally, fluorescent substances made of rare earth complexes are advantageous in the following respects as compared with the ordinary organic fluorescent substances. One example of the rare earth complexes which is useful in a lower molecular organic EL element can be represented by the following formula (6).

(6)

In the rare earth complex shown by the following formula (6), the ligand thereof is constituted by phenanthroline and β-diketone. As this phenanthroline absorbs light, an excited state thereof is caused to occur, thereby permitting energy shift to occur from the triplet excitation state to the central europium, thus making it possible to obtain a light emission of 612 nm which is peculiar to europium.

Since this rare earth complex is capable of absorbing light through phenanthroline, the absorption coefficient thereof is relatively large, thus enhancing the intensity of luminescence. The fluorescent substance including the aforementioned rare earth complex has the following advantages as compared with the fluorescent substance consisting of an ordinary organic compound.

1) The wavelength of emission is peculiar to rare earth elements and the luminescent spectrum is quite stable, i.e. free from any influence that may be caused due to differences in color concentration and in kinds of polymer dispersant.

2) Although the ligand is constituted by an organic compound, once the ligand is turned into an excited state as it absorbs light, the ligand is permitted to return to its ground state due to the shift of energy to the central element, so that the opportunity of generating an irreversible chemical change from the excited state can be minimized. As a result, the fluorescent substance is expected to have excellent resistivity to ultraviolet rays.

However, the fluorescent substance including the aforementioned rare earth complex having phenanthroline as a ligand is accompanied with problems that the solubility thereof to a solvent as well as the dispersibility thereof to a resin are poor.

Whereas, the fluorescent substance including a rare earth complex represented by the following formula (7) is excellent in solubility to a solvent and can be homogeneously dispersed in a resin.

(7)

However, the rare earth complex represented by the formula (7) is accompanied by the problems that the absorption coefficient thereof in a near ultraviolet region is relatively small, so that it is impossible to secure sufficient intensity of luminescence.

Whereas, the employment of a rare earth complex where triphenylphosphine oxide is employed as a ligand as shown by the following formula (8) is proposed (see for example, Chemistry and Industries Vol. 53, No. 2 (2000), pp. 126-130; Journal of Organic Synthetic Chemistry Association, Vol. 58, No. 10 (2000), pp. 945-955; Chem. Lett. (1999), pp. 35-36).

(8)

The compound represented by the formula (8) is higher in luminosity as compared with the compound represented by the aforementioned formula (7) but is still insufficient for use in the light emitting device, so that the luminosity thereof is required to be further improved.

SUMMARY

One of the objects of the present invention is to provide a light emitting device of high luminosity and long life, which comprises a light emitting element and a luminescent medium including a rare earth complex which is excellent in solubility to a solvent and in resin dispersibility as well as high in luminosity is employed.

According to a first aspect of the present invention, there is provided a light emitting device which comprises a light emitting element and a luminescent medium, the luminescent medium containing a rare earth complex wherein a compound represented by the following formula (1) is employed as a ligand.

(1)

wherein X and Y are the same or different and are individually O, S or Se; R1, R2, R3 and R4 are the same or different, excluding a situation where R1, R2, R3 and R4 are all the same as each other, and are individually an alkyl or alkoxy group of a linear or branched structure having not more than 20 carbon atoms, a phenyl group, a biphenyl group, a naphthyl group, a heterocyclic group or a substitution product of any of these groups; n is an integer ranging from 2 to 20; and Z and W are the same or different and are individually a hydrogen atom, a deuterium atom, a halogen atom or an alkyl group.

According to a second aspect of the present invention, there is provided a light emitting device which comprises a light emitting element and a luminescent medium containing a rare earth complex represented by the following formula (5).

(5)

wherein Ln is a rare earth ion; X and Y are the same or different and are individually O, S or Se; $R_1$, $R_2$, $R_3$, $R_4$, $R_5$ and $R_6$ are the same or different, excluding a situation where a combination of $R_1$, $R_2$ and $R_3$ is the same as a combination of $R_4$, $R_5$ and $R_6$, and are individually an alkyl or alkoxy group a linear or branched structure having not more than 20 carbon atoms, a phenyl group, a biphenyl group, a naphthyl group, a heterocyclic group or a substitution product of any of these groups; $R_7$ and $R_9$ are the same or different and are individually an alkyl or alkoxy group of a linear or branched structure, a phenyl group, a biphenyl group, a naphthyl group, a heterocyclic group or a substitution product of any of these groups; and $R_8$ is a halogen atom, a deuterium atom, or an aliphatic group of a linear or branched structure having 1 to 22 carbon atoms.

According to a third aspect of the present invention, there is provided a luminescent medium containing a rare earth complex wherein a compound represented by the following formula (1) is employed as a ligand.

(1)

wherein X and Y are the same or different and are individually O, S or Se; $R_1$, $R_2$, $R_3$ and $R_4$ are the same or different, excluding a situation where $R_1$, $R_2$, $R_3$ and $R_4$ are all the same as each other, and are individually an alkyl or alkoxy group of a linear or branched structure having not more than 20 carbon atoms, a phenyl group, a biphenyl group, a naphthyl group, a heterocyclic group or a substitution product of any of these groups; n is an integer ranging from 2 to 20; and Z and W are the same or different and are individually a hydrogen atom, a deuterium atom, a halogen atom or an alkyl group.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF EXEMPLARY EMBODIMENTS

The light emitting device according to one embodiment of the present invention includes a light emitting element and a luminescent medium. The light emitting element is any element which emits a light. A LED (light emitting diode) chip may be employed as a light emitting element.

A luminescent medium contains a rare earth complex wherein a compound represented by the following formula (1) is employed as a ligand.

The rare earth complex to be employed in the light emitting device according to one embodiment of the present invention may be selected from those containing the ligand represented by the aforementioned formula (1) and β-diketone ligand. As for specific examples of the aforementioned rare earth complex, it is possible to employ a compound represented by the following formula (2).

(2)

wherein Ln is a rare earth ion; X and Y are the same or different and are individually O, S or Se; $R_1$, $R_2$, $R_3$, $R_4$, $R_5$ and $R_6$ are the same or different, excluding a situation where $R_1$, $R_2$, $R_3$ and $R_4$ are all the same as each other, and are individually an alkyl or an alkoxy group of a linear or branched structure having not more than 20 carbon atoms, a phenyl group, a biphenyl group, a naphthyl group, a heterocyclic group or a substitution product of any of these groups; n is an integer ranging from 2 to 20; m and p are respectively an integer ranging from 1 to 5; and Z and W are the same or different and are individually a hydrogen atom, a deuterium atom, a halogen atom or an alkyl group.

In the formula (2), the hydrogen atom (H) interposed between $R_5$ and $R_6$ may be substituted by a deuterium (D), a halogen atom, or alkyl group thereby making it possible to stabilize the ligand.

When plural kinds (two kinds in particular) of phosphorus compounds each differing in structure are coordinated to a single rare earth atom, the ligand field becomes more asymmetrical and hence the intensity of luminescence is caused to increase owing to the enhancement of the molecular extinction coefficient. Especially, when a phosphorus compound of asymmetric structure as shown in the formula (1) is employed as a ligand of the rare earth complex, a further increase in luminosity can be achieved as compared with a case where a phosphorus compound of a different molecular structure is coordinated to the compound represented by the formula (7).

Further, since the rare earth complex has an improved amorphous property, dispersibility of the rare earth complex in resin is further increased.

As described hereinafter, although it is possible to obtain an asymmetric structure by simply coordinating two kinds of phosphorus compounds each differing in structure to a rare earth complex, there may be produced a mixture comprising a symmetric structure and an asymmetric structure. Whereas when a phosphorus compound of asymmetric structure as shown in the formula (1) is employed as a ligand, it would become possible, without fail, to coordinate two kinds of phosphorus compounds each differing in structure to a single rare earth element.

Further, when the compound shown in the formula (1) is employed as a ligand, it would become possible to observe improvement in luminosity half life.

This rare earth complex is generally constituted by a ligand exhibiting Lewis basicity, and the coordinate bond of rare earth element exhibiting Lewis acidity. In this case, when an impurity which is strong in Lewis basicity is permitted to intervene, ligand exchange would be caused to occur, thereby causing the intensity of luminescence to attenuate. When the coordinate bond is effected through monopoint bonding as in the case of phosphine oxide, the opportunity of ligand exchange would be increased, thus decreasing the luminosity half life. Whereas, in the case of bis-phosphine oxide ligand, since the coordinate bond is effected through multipoint bonding, the ligand can be hardly dissociated due to the chelate effect, thus improving the luminosity half life.

Figure 1:
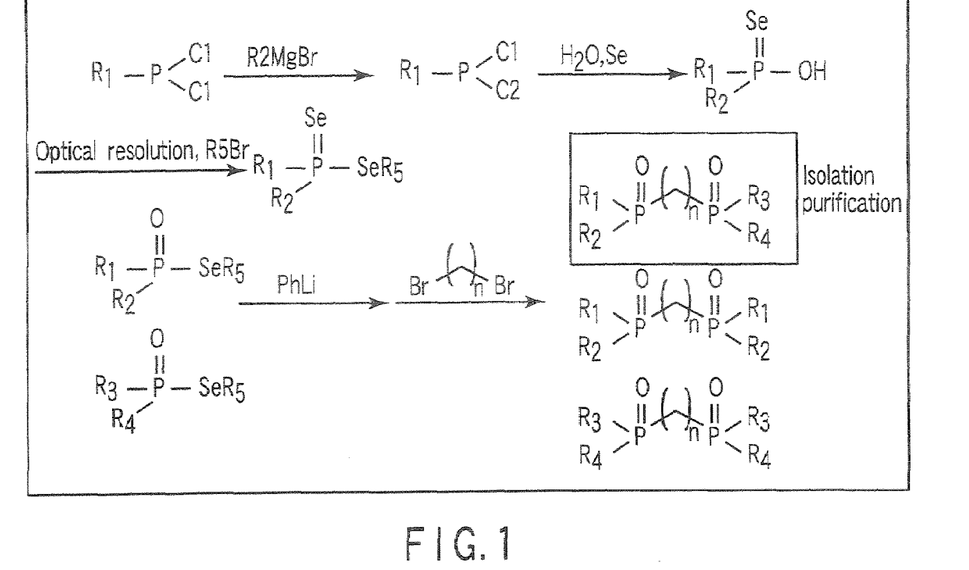
FIG. 1 is a diagram illustrating the synthesis scheme of bisphosphine oxide ligand of a rare earth complex to be employed in the light emitting device according to one embodiment of the present invention.

The ligand of the phosphorus compound (bis-phosphine oxide, etc.) represented by the formula (1) may be chiral (optically active). The chiral phosphorus compound ligand can be obtained by way of the reactions as shown in FIG. 1 for instance. An optically inactive phosphorus compound (bis-phosphine oxide, etc.) can also be obtained by way of the method corresponding to the method shown in FIG. 1.

Further, as described above, when plural kinds of phosphorus compounds each differing in structure are coordinated to a single rare earth atom, it is certainly possible to increase the intensity of luminescence. However, when β-diketone ligand is concurrently employed on the occasion of employing, as a ligand, a phosphorus compound of asymmetric structure as shown in the formula (1), the effect of asymmetry can be further enhanced, thus greatly increasing the luminosity.

A rare earth element Ln in the aforementioned formula (2) and in the formula (5) to be described hereinafter should preferably be selected from europium (Eu), terbium (Tb) and gadolinium (Gd).

The aforementioned rare earth complex is dispersed in a polymer to thereby produce a luminescent medium. As for the content of the rare earth complex in the polymer, although there is not any particular limitation, it should preferably be confined in general within the range of 2 to 95% by weight.

As for specific examples of the polymer in which the rare earth complex is dispersed, it may be to employ fluorine-based resin which is high in light transmissivity (visible and ultraviolet light), in glass transition point, in fastness and in moisture resistance and low in gas permeability. Further, in order to prevent the vibration extinction in the course from the excited state of the rare earth complex to the ligand, the rare earth complex may be constructed such that C—H linkage and O—H linkage do not existed in the vicinity of the rare earth atom. As a result of the repetition of intensive studies by taking the aforementioned matters into consideration, the present inventors have found that polymers having molecular structures represented by the following formulas (3) and (4)

are useful in improving not only the luminosity but also the luminosity half life of the LED.

(3)

wherein q and r are respectively an integer of 1 or more; and $Rf_1$, and $Rf_2$ are individually an alkyl group of a linear or branched structure containing at least one fluorine atom and not more than 20 carbon atoms.

(4)

wherein s and t are respectively an integer of 1 or more.

The rare earth complex can be obtained not only through the employment of bis-phosphine oxide as a ligand, but also through the interaction of two kinds of phosphine oxide.

For example, when two kinds of phosphine oxide (1) and (2) are interacted to form the compound represented by the formula (7), there will be generated a mixture comprising a complex where only phosphine oxide (1) is coordinated thereto, a complex where only phosphine oxide (2) is coordinated thereto, and a complex where both kinds of phosphine oxide (1) and (2) are coordinated thereto. In this case, on account of the rare earth complex where both kinds of phosphine oxide (1) and (2) are coordinated thereto, it is possible to obtain a large intensity of luminescence.

As for specific examples of the rare earth complex where two kinds of phosphine are coordinated thereto, the compounds represented by the following formula (5) can be exemplified.

(5)

wherein Ln is a rare earth ion; X and Y are the same or different and are individually O, S or Se; $R_1$, $R_2$, $R_3$, $R_4$, $R_5$ and $R_6$ are the same or different, excluding a situation where a combination of $R_1$, $R_2$ and $R_3$ is the same as a combination of $R_4$, $R_5$ and $R_6$, and are individually an alkyl or alkoxy group of a linear or branched structure having not more than 20 carbon atoms, a phenyl group, a biphenyl group, a naphthyl group, a heterocyclic group or a substitution product of any of these groups; $R_7$ and $R_9$ are the same or different and are individually an alkyl or alkoxy group of a linear or branched structure having not more than 20 carbon atoms, a phenyl group, a biphenyl group, a naphthyl group, a heterocyclic group or a substitution product of any of these groups; and $R_8$ is a halogen atom, a deuterium atom, or an aliphatic group of a linear or branched structure having 1 to 22 carbon atoms.

The rare earth complex where two kinds of phosphine oxide are coordinated thereto can be also dispersed in a polymer as described above to thereby obtain a luminescent medium.

In the present invention, a hydrogen atom of $R_1$ to $R_9$ may be substituted by a halogen or deuterium, especially preferable example of the halogen being a fluorine atom. The reason for this is that the vibration extinction due to C—H linkage can be prevented by this fluorine atom. Further, when a fluorine atom is employed, the effect of steric hindrance will be increased, thereby making it possible to prevent impurities from being coordinated to the rare earth element. Moreover, when C—H linkage or O—H linkage is included in the polymer to be employed for dispersing the rare earth complex, the distance between the central rare earth ion and C—H linkage or O—H linkage can be enlarged due to the effect of steric hindrance, thus preventing the generation of vibration extinction.

Next, various examples according to the present invention as well as comparative examples will be explained. It should be noted that these examples are not intended to limit the scope of the present invention.

EXAMPLE 1

By following the reaction formula represented by the following formula (9), a rare earth complex was synthesized. Namely, two kinds of phosphine oxide, i.e., triphenylphosphine oxide and trioctylphosphine oxide were employed as a ligand and acted on a rare earth metal compound to thereby obtain the rare earth complex. This rare earth complex was then dissolved in Bartrel XF (tradename: fluorine-based solvent, Du Pont Co., Ltd.) to obtain a solution in which pellets of Teflon AF (tradename: one kind of the fluorine-based polymer represented by the aforementioned formula (3), Du Pont Co., Ltd.) to obtain a 2 wt % solution thereof.

(9)

Figure 2:
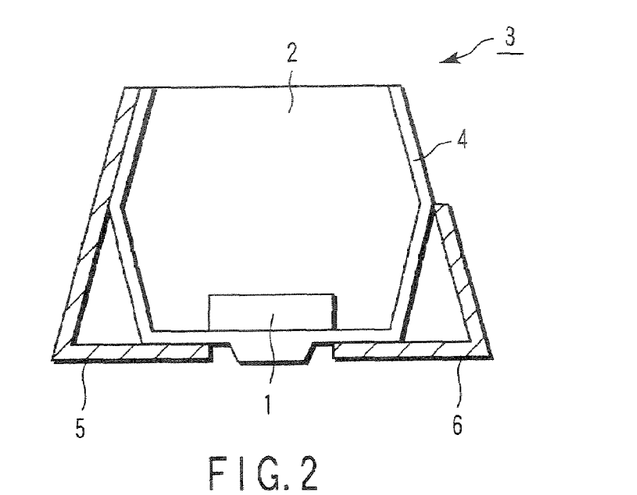
FIG. 2 is a cross-sectional view schematically illustrating the light emitting device according to one embodiment of the present invention.

The solution thus prepared was housed, as shown in FIG. 2, in a cell 4 provided with an LED (light emitting diode) chip 1 (emission wavelength: 395 nm, InGaN) and was thermally dried in a nitrogen atmosphere to obtain a luminescent medium 2, thus manufacturing an LED element 3. In FIG. 2, reference numerals 5 and 6 are respectively an electrode terminal.

Then, the LED chip 1 of the light emitting device 3 was permitted to emit to measure the luminosity and the luminosity half life thereof. Specifically, the luminosity and the luminosity half life were measured by making use of an integrating sphere photometer with the LED chip 1 being emitted under the conditions of 20 mA and 3.43 V. The luminosity was evaluated by making use of a luminous flux (1 m) or a luminous intensity (mcd). The luminosity half life was evaluated by way of the time (h) required to reduce the luminance to a half due to the emission of the LED chip 1.

As a result, it was possible to obtain an excellent emission of red color, thus obtaining measured values as shown in the following Table 1. As apparent from the following Table 1, according to the light emitting device 3 of this example, it was possible to obtain an excellent luminosity and an excellent luminosity half life which was as long as 25000 hours.

COMPARATIVE EXAMPLE 1

A rare earth complex was synthesized in the same manner as described in Example 1 except that a phosphine oxide employed as a ligand was limited to only triphenylphosphine oxide in the reaction formula shown in the aforementioned formula (9). Then, by making use of this rare earth complex, a light emitting device was manufactured.

The luminosity and the luminosity half life of the light emitting device were measured in the same manner as described in Example 1. As a result, as shown in the following Table 1, the luminosity of the light emitting device was as low as 72 when the luminosity of the light emitting device of Example 1 was assumed as being 100. Further, the luminosity half life thereof was only 15000 hours, indicating a prominent reduction of half life as compared with the light emitting device of Example 1.

COMPARATIVE EXAMPLE 2

A rare earth complex was synthesized in the same manner as described in Example 1 except that the phosphine oxide employed as a ligand was limited to only trioctylphosphine oxide in the reaction formula shown in the aforementioned formula (9). Then, by making use of this rare earth complex, a light emitting device was manufactured.

The luminosity and the luminosity half life of the light emitting device were measured in the same manner as described in Example 1. As a result, as shown in the following Table 1, the luminosity of the light emitting device was as low as 90 when the luminosity of the light emitting device of Example 1 was assumed as being 100. Further, the luminosity half life thereof was only 15000 hours, indicating a prominent reduction of half life as compared with the light emitting device of Example 1.

EXAMPLE 2

A rare earth complex was synthesized in the same manner as described in Example 1 except that the phosphine oxide employed as a ligand was replaced by bis-phosphine oxide having a structure represented by the following formula (10) in the reaction formula shown in the aforementioned formula (9). Then, by making use of this rare earth complex, a light emitting device was manufactured.

(10)

The luminosity and the luminosity half life of the light emitting device were measured in the same manner as described in Example 1. As a result, as shown in the following Table 1, the luminosity of the light emitting device was as high as 110 when the luminosity of the light emitting device of Example 1 was assumed as being 100. Further, the luminosity half life thereof was 45000 hours, indicating a prominent increase of half life as compared with the light emitting device of Example 1.

This prominent increase in luminosity half life was considered attributed to the chelate effect due to the employment of the bisphosphine oxide as a ligand.

EXAMPLE 3

A rare earth complex was synthesized in the same manner as described in Example 1 except that the phosphine oxide employed as a ligand was replaced by bis-phosphine oxide having a structure represented by the following formula (11) in the reaction formula shown in the aforementioned formula (9). Then, by ma king use of this rare earth complex, a light emitting device was manufactured.

(11)

The luminosity and the luminosity half life of the light emitting device were measured in the same manner as described in Example 1. As a result, as shown in the following Table 1, the luminosity of the light emitting device was as high as 130 when the luminosity of the light emitting device of Example 1 was assumed as being 100. Further, the luminosity half life thereof was 45000 hours, indicating a prominent increase of half life as compared with the light emitting device of Example 1.

This prominent increase in luminosity half life was considered attributed to increased asymmetry of the ligand.

EXAMPLE 4

A light emitting device was manufactured in the same manner as described in Example 1 except that Cytop (tradename: Asashi Glass Co., Ltd.) was employed as a fluorine-based polymer for dispersing a rare earth complex.

The luminosity and the luminosity half life of the light emitting device were measured in the same manner as in Example 1. As a result, as shown in the following Table 1, the luminosity and the luminosity half life thereof were both somewhat inferior as compared with the light emitting device of Example 1 but were found substantially satisfactory from a practical viewpoint.

EXAMPLE 5

A red rare earth complex obtained in Example 2, a green (InGaN, 520 nm) inorganic fluorescent substance and a blue (InGaN, 450 nm) inorganic fluorescent substance were dispersed in the polymer employed in Example 1 and treated in the same manner as in Example 1, thereby manufacturing an organic/inorganic hybrid type white light emitting device.

Then, the luminosity half life thereof was measured in the same manner as in Example 1, finding that the luminosity half life thereof was 40000 hours as shown in the following Table 1, indicating a prominent increase of half life as compared with the light emitting device of Example 1.

EXAMPLE 6

The fluorine-based polymer can be selected from fluoroethylene, fluoropropylene and vinylidene fluoride. For example, as a specific example of the fluorine-based polymer for dispersing the rare earth complex, Dynion THV220 (tradename: Sumitomo 3M Co., Ltd.) was employed, the resultant dispersed solution being subsequently employed in the same manner as in Example 1 to manufacture a light emitting device.

The luminosity and the luminosity half life of this light emitting device were measured in the same manner as in Example 1. As a result, it was possible to obtain substantially satisfactory results from a practical viewpoint as shown in the following Table 1.

EXAMPLE 7

The fluorine-based polymer may be those having a molecular structure represented by the following formula (12). For example, as a specific example of the fluorine-based polymer for dispersing the rare earth complex, SIFEL (tradename: Shinetsu Chemicals Co., Ltd.) was employed, the resultant dispersed solution being subsequently employed in the same manner as in Example 1 to manufacture a light emitting device.

The luminosity and the luminosity half life of this light emitting device were measured in the same manner as in Example 1. As a result, it was possible to obtain substantially satisfactory results from a practical viewpoint as shown in the following Table 1.

(12)

wherein $R_{11}$, $R_{12}$, $R_{13}$, $R_{14}$, $R_{15}$ and $R_{16}$ are the same or different and are individually an alkyl group formed of a linear or branched structure (part or all of a hydrogen atom may be substituted by a halogen such as a fluorine atom) having 1 to 22 carbon atoms; and u is an integer of 1 or more.

EXAMPLE 8

A red rare earth complex (europium complex) obtained in Example 1, a green terbium complex obtained through the reaction shown in the following formula (13), and a blue inorganic fluorescent substance (InGaN, 450 nm) were dispersed in the polymer employed in Example 1 and treated in the same manner as in Example 1, thereby manufacturing an organic/inorganic hybrid type white light emitting device.

Then, the luminosity half life of this white light emitting device was measured in the same manner as in Example 1, finding that the luminosity half life thereof was 35000 hours as shown in the following Table 1, indicating a prominent increase of half life as compared with the light emitting device of Example 1. Further, this white light emitting device exhibited a relative luminosity of 150, indicating a more excellent result as compared with that of Example 1. The reason for this can be assumedly attributed to the fact that since not only the red fluorescent substance but also the green fluorescent substance were formed of an organic fluorescent substance, the ratio of inorganic fine particles was permitted to reduce, thus making it possible to minimize the light scattering and hence to enhance the light take-off efficiency of the light emitting device.

(13)

EXAMPLE 9

A red rare earth complex (europium complex) obtained in Example 1, and a green terbium complex obtained through the reaction shown in the aforementioned formula (13) were dispersed in a blue fluorescent polymer represented by the following formula (14) and treated in the same manner as in Example 1, thereby manufacturing a white light emitting device having a layer of fluorescent substance.

Then, the luminosity half life of this white light emitting device was measured in the same manner as in Example 1, finding that the luminosity half life thereof was 30000 hours as shown in the following Table 1, indicating a prominent increase of half life as compared with the light emitting device of Example 1. Further, this white light emitting device exhibited a relative luminosity of 180, indicating a more excellent result as compared with that of Example 1. The reason for this can be assumedly attributed to the fact that since not only the red fluorescent substance but also the green fluorescent substance as well as the blue fluorescent substance were all formed of an organic fluorescent substance, it was possible to minimize the light scattering and hence to enhance the light take-off efficiency of the light emitting device.

(14)

wherein v is an integer of 1 or more.

COMPARATIVE EXAMPLE 3

A rare earth complex was synthesized in the same manner as described in Example 1 except that the phosphine oxide employed as a ligand was substituted by bis-phosphine oxide having a structure represented by the following formula (15) in the reaction formula shown in the aforementioned formula (9). Then, by making use of this rare earth complex, a light emitting device was manufactured.

The luminosity and the luminosity half life of this light emitting device were measured in the same manner as in Example 1. As a result, the luminosity of the light emitting device was as low as 90 and the luminosity half life thereof was only 15000 hours. It was confirmed from these results that unless n is an integer larger than 1, it was impossible to enhance the luminosity as well as the luminosity half life of the light emitting device.

(15)

EXAMPLE 10

A light emitting device was manufactured in the same manner as described in Example 1 except that the compound represented by the following formula (16) was employed as a rare earth complex.

The luminosity and the luminosity half life of the light emitting device were measured in the same manner as described in Example 1. As a result, as shown in the following Table 1, the luminosity of the light emitting device was as high as 120 when the luminosity of the light emitting device of Example 1 was assumed as being 100. Further, the luminosity half life thereof was 25000 hours, which was the same with that of the light emitting device of Example 1.

(16)

EXAMPLE 11

A light emitting device was manufactured in the same manner as described in Example 1 except that the compound represented by the following formula (17) was employed as a rare earth complex.

The luminosity and the luminosity half life of the light emitting device were measured in the same manner as described in Example 1. As a result, as shown in the following Table 1, the luminosity of the light emitting device was as high as 150 when the luminosity of the LED element of Example 1 was assumed as being 100. Further, the luminosity half life thereof was 45000 hours as shown in the following Table 1, indicating a prominent increase of half life as compared with the light emitting device of Example 1.

(17)

EXAMPLE 12

A light emitting device was manufactured in the same manner as described in Example 1 except that Cefral (trade name: Central Glass Co., Ltd.) represented by the following formula (18) was employed as a fluorine-based polymer, and xylene was employed as a solvent.

The luminosity and the luminosity half life of the light emitting device were measured in the same manner as described in Example 1. As a result, as shown in the following Table 1, the luminosity of the light emitting device was as high as 250 when the luminosity of the LED element of Example 1 was assumed as being 100. Further, the luminosity half life thereof was 20000 hours as shown in the following Table 1, indicating a prominent increase of luminosity as compared with the light emitting device of Example 1.

The reason for this can be assumedly attributed to the fact that since Cefral has a light scattering intensity lower than that of Tefron AF, the light emitting device of this example has a high emission efficiency of light.

(18)

wherein X is a halogen, and R17 to R19 are the same or different and are individually an alkyl group having a linear or branched structure having 1 to 22 carbon atoms.

EXAMPLE 13

A light emitting device was manufactured in the same manner as described in Example 1 except that Lumifron (trade name: Asashi Glass Co., Ltd.) represented by the following formula (19) was employed as a fluorine-based polymer, and ethyl acetate was employed as a solvent.

The luminosity and the luminosity half life of the light emitting device were measured in the same manner as described in Example 1. As a result, as shown in the following Table 1, the luminosity of the light emitting device was as high as 200 when the luminosity of the LED element of Example 1 was assumed as being 100. Further, the luminosity half life thereof was 25000 hours as shown in the following Table 1, indicating a prominent increase of luminosity as compared with the light emitting device of Example 1.

The reason for this can be assumedly attributed to the fact that since Lumifron has a light scattering intensity lower than that of Tefron AF, the light emitting device of this example has a high emission efficiency of light.

(19)

wherein X is a halogen, R20 is an alkyl group having a linear or branched structure having 1 to 22 carbon atoms, and n is an integer of 1 or more.

EXAMPLE 14

A light emitting device was manufactured in the same manner as described in Example 1 except that polysilane represented by the following formula (20) was employed as a fluorine-based polymer.

The luminosity and the luminosity half life of the light emitting device were measured in the same manner as described in Example 1. As a result, as shown in the following Table 1, the luminosity of the light emitting device was as high as 105 when the luminosity of the LED element of Example 1 was assumed as being 100. Further, the luminosity half life thereof was 20000 hours as shown in the following Table 1.

(20)

wherein R21 and R22 are methyl group, and n is an integer of 1 or more.

|  | Luminosity* | Luminosity half life |
|---|---|---|
| Ex. 1 | 100 | 25000 hours |
| Ex. 2 | 110 | 45000 hours |
| Ex. 3 | 130 | 45000 hours |
| Ex. 4 | 95 | 20000 hours |
| Ex. 5 | — | 40000 hours |
| Ex. 6 | 120 | 25000 hours |
| Ex. 7 | 110 | 20000 hours |
| Ex. 8 | 150 | 35000 hours |
| Ex. 9 | 180 | 30000 hours |
| Ex. 10 | 120 | 25000 hours |
| Ex. 11 | 150 | 45000 hours |
| Ex. 12 | 250 | 20000 hours |
| Ex. 13 | 200 | 25000 hours |
| Ex. 14 | 105 | 20000 hours |
| Comp. Ex. 1 | 72 | 15000 hours |
| Comp. Ex. 2 | 90 | 15000 hours |
| Comp. Ex. 3 | 90 | 15000 hours |

*Relative value based on Example 1.

Although phosphine oxide was employed as a ligand of the rare earth complex in the foregoing examples, the present invention is not limited to the cases where phosphine oxide is employed. Namely, even if phosphine sulfide or phosphine selenide is employed, almost the same effects can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:
1. A light emitting device, comprising:
a light emitting element; and
a luminescent medium formed on the light emitting element;
wherein:
the luminescent medium comprises a fluorine-based polymer and the rare earth complex dispersed therein, the rare earth complex being represented by the following formula (2):

(2)

wherein Ln is a rare earth metal ion selected from the group consisting of europium, terbium and erbium; X and Y are the same or different and are individually O, S or Se; $R_1$, $R_2$, $R_3$, $R_4$, $R_5$ and $R_6$ are the same or different, excluding a situation where $R_1$, $R_2$, $R_3$ and $R_4$ are all the same as each other, and are individually an alkyl or alkoxy group of a linear or branched structure having not more than 20 carbon atoms, a phenyl group, a biphenyl group, a naphthyl group, a heterocyclic group or a substitution product of any of these groups; n is an integer ranging from 2 to 20; m and p are respectively an integer ranging from 1 to 5; and Z and W are the same or different and are individually a hydrogen atom, a deuterium atom, a halogen atom or an alkyl group.

2. The light emitting device according to claim 1, wherein the fluorine-based polymer has a molecular structure represented by the following formula (3):

(3)

wherein q and r are respectively an integer of 1 or more; and $Rf_1$ and $Rf_2$ are individually an alkyl group of a linear or branched structure containing at least one fluorine atom and not more than 20 carbon atoms.

3. The light emitting device according to claim 1, wherein the fluorine-based polymer is represented by the following formula (4):

(4)

wherein s and t are respectively an integer of 1 or more.

4. The light emitting device according to claim 1, wherein the luminescent medium comprises an inorganic fluorescent substance which is dispersed together with the rare earth complex in the fluorine-based polymer.

5. The light emitting device according to claim 1, wherein the fluorine-based polymer is one synthesized from at least one monomer selected from the group consisting of fluoroethylene, fluoropropylene, and vinylidene fluoride.

6. The light emitting device according to claim 1, wherein the fluorine-based polymer has a molecular structure represented by the following formula (12):

(12)

wherein $R_{11}$, $R_{12}$, $R_{13}$, $R_{14}$, $R_{15}$ and $R_{16}$ are the same or different and are individually an alkyl group formed of a linear or branched structure; and u is an integer of 1 or more.

7. The light emitting device according to claim 1, wherein the fluorine-based polymer has a repeating unit represented by the following formula (18):

(18)

wherein X is a halogen, and $R_{17}$ to $R_{19}$ are the same or different and are individually an alkyl group having a linear or branched structure.

8. The light emitting device according to claim 1, wherein the fluorine-based polymer has a molecular structure represented by the following formula (19):

(19)

wherein X is a halogen, $R_{20}$ is an alkyl group having a linear or branched structure, and n is an integer of 1 or more.

9. The light emitting device according to claim 1, wherein the fluorine-based polymer has a molecular structure represented by the following formula (20):

(20)

wherein $R_{21}$ and $R_{22}$ are methyl group, and n is an integer of 1 or more.

10. The light emitting device according to claim 1, wherein:
the luminescent medium comprises the fluorine-based polymer, the rare earth complex as a red fluorescent substance, and an inorganic fluorescent substance as a green or blue fluorescent substance;
the rare earth complex and the inorganic fluorescent substance are dispersed in the fluorine based polymer; and
the rare earth complex is a europium complex.

11. The light emitting device according to claim 1, wherein:
the luminescent medium comprises the fluorine-based polymer, the rare earth complex as a red or green fluorescent substance, and an inorganic fluorescent substance as a blue fluorescent substance;
the rare earth complex and the inorganic fluorescent substance are dispersed in the fluorine based polymer;
the rare earth complex is a europium complex as a red fluorescent substance; and
the rare earth complex is at least one complex selected from the group consisting of a terbium complex and an erbium complex as a green fluorescent substance.

12. The light emitting device according to claim 1, wherein $R_1$ and $R_2$ are the same, $R_3$ and $R_4$ are the same, and a combination of $R_1$ and $R_2$ is different from a combination of $R_3$ and $R_4$.

13. The light emitting device according to claim 12, wherein $R_1$ and $R_2$ are an alkyl group of a linear or branched structure having not more than 20 carbon atoms, and $R_3$ and $R_4$ are a phenyl group.

14. A light emitting device, comprising:
a light emitting element; and
a luminescent medium formed on the light emitting element;
wherein:
the luminescent medium comprises a rare earth complex as a red or green fluorescent substance, and a polymer fluorescent substance as a blue fluorescent substance;

the rare earth complex is a europium complex as a red fluorescent substance;
the rare earth complex is at least one complex selected from the group consisting of a terbium complex and an erbium complex as a green fluorescent substance; and
the rare earth complex is represented by the following formula (5):

(5)

wherein Ln is a rare earth metal ion selected from the group consisting of europium, terbium and erbium; X and Y are the same or different and are individually O, S or Se; $R_1$, $R_2$, $R_3$, $R_4$, $R_5$ and $R_6$ are the same or different, excluding a situation where a combination of $R_1$, $R_2$ and $R_3$ is the same as a combination of $R_4$, $R_5$ and $R_6$, and are individually an alkyl or alkoxy group of a linear or branched structure having not more than 20 carbon atoms, a phenyl group, a biphenyl group, a naphthyl group, a heterocyclic group or a substitution product of any of these groups; $R_7$ and $R_9$ are the same or different and are individually an alkyl or alkoxy group of a linear or branched structure, a phenyl group, a biphenyl group, a naphthyl group, a heterocyclic group or a substitution product of any of these groups; and $R_8$ is a halogen atom, a deuterium atom, or an aliphatic group of a linear or branched structure having 1 to 22 carbon atoms.

15. The light emitting device according to claim 14, wherein the luminescent medium comprises the rare earth complex as a red fluorescent substance, and an inorganic fluorescent substance as a green or blue fluorescent substance; wherein said rare earth complex is a europium complex.

16. The light emitting device according to claim 14, wherein the luminescent medium comprises the rare earth complex as a red or green fluorescent substance, and an inorganic fluorescent substance as a blue fluorescent substance; wherein said rare earth complex is a europium complex as a red fluorescent substance, and said rare earth complex is at least one complex selected from the group consisting of a terbium complex and an erbium complex as a green fluorescent substance.

17. A light emitting device, comprising:
a light emitting element; and
a luminescent medium formed on the light emitting element;
wherein:
the luminescent medium comprises a rare earth complex as a red or green fluorescent substance, and a polymer fluorescent substance as a blue fluorescent substance;
the rare earth complex is a europium complex as a red fluorescent substance;
the rare earth complex is at least one complex selected from the group consisting of a terbium complex and an erbium complex as a green fluorescent substance; and
the rare earth complex is represented by the following formula (2):

(2)

wherein Ln is a rare earth metal ion selected from the group consisting of europium, terbium and erbium; X and Y are the same or different and are individually O, S or Se; $R_1$, $R_2$, $R_3$, $R_4$, $R_5$ and $R_6$ are the same or different, excluding a situation where $R_1$, $R_2$, $R_3$ and $R_4$ are all the same as each other, and are individually an alkyl or alkoxy group of a linear or branched structure having not more than 20 carbon atoms, a phenyl group, a biphenyl group, a naphthyl group, a heterocyclic group or a substitution product of any of these groups; n is an integer ranging from 2 to 20; m and p are respectively an integer ranging from 1 to 5; and Z and W are the same or different and are individually a hydrogen atom, a deuterium atom, a halogen atom or an alkyl group.

* * * * *